(12) United States Patent
Yen et al.

(10) Patent No.: US 8,890,114 B2
(45) Date of Patent: Nov. 18, 2014

(54) LIGHT-EMITTING DEVICE

(71) Applicant: Epistar Corporation, Hsinchu (TW)

(72) Inventors: Sheng-Horng Yen, Hsinchu (TW); Ta-Cheng Hsu, Hsinchu (TW); Yu-Jiun Shen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/653,140

(22) Filed: Oct. 16, 2012

(65) Prior Publication Data

US 2014/0103290 A1    Apr. 17, 2014

(51) Int. Cl.
*H01L 33/06* (2010.01)

(52) U.S. Cl.
USPC ............. 257/13; 438/34; 438/37; 438/40; 438/44; 438/47

(58) Field of Classification Search
CPC ............. H01L 21/0254; H01L 33/007; H01L 21/02458; H01L 21/0237; H01L 21/02639; H01L 33/06; H01L 33/04; H01L 2924/0002; H01L 33/32; H01L 33/24; H01L 2924/00; H01L 33/20; H01L 2224/48091; H01L 27/1214; H01L 27/3246; H01L 2224/97; H01L 2224/48247; H01L 2224/73265; H01S 5/34333
USPC ..................... 257/13, 94, 97, 98, 99
See application file for complete search history.

(56) References Cited

U.S. PATENT DOCUMENTS

| | | | |
|---|---|---|---|
| 2006/0078020 A1* | 4/2006 | Izu et al. | 372/43.01 |
| 2012/0187365 A1* | 7/2012 | Jeong et al. | 257/9 |
| 2013/0056785 A1* | 3/2013 | Hwang | 257/99 |

* cited by examiner

*Primary Examiner* — Chuong A Luu
*Assistant Examiner* — Rodolfo Fortich
(74) *Attorney, Agent, or Firm* — Dittavong & Steiner, P.C.

(57) ABSTRACT

A light-emitting device comprises a first semiconductor layer; a second semiconductor layer; an active layer formed between the first semiconductor layer and the second semiconductor layer; a first electron blocking layer formed between the first semiconductor layer and the active layer; and a second electron blocking layer formed between the second semiconductor layer and the active layer, wherein the thickness of the second electron blocking layer is not equal to that of the first electron blocking layer, and/or the band gap energy of the second electron blocking layer is not equal to that of the first electron blocking layer.

17 Claims, 6 Drawing Sheets

LIGHT-EMITTING DEVICE

TECHNICAL FIELD

The application relates to a light-emitting device, and more particularly, to a light-emitting device comprising a first electron blocking layer and a second electron blocking layer.

DESCRIPTION OF BACKGROUND ART

The light-emitting diode (LED) is a solid state semiconductor device. The structure of the LED comprises a p-type semiconductor layer, an n-type semiconductor layer, and an active layer formed between the p-type semiconductor layer and the n-type semiconductor layer. The light-emitting principle of the LED is the transformation of electrical energy to optical energy by applying an electrical current to the p-n junction to generate electrons and holes. Then, the LED emits a light when the electrons and the holes combine. Because of poor hole injection and low hole mobility, the overflow of the electron from the active layer into the p-type semiconductor layer is a significant problem in the LED. Electron overflow reduces both power and efficiency of the LED.

FIG. 1A illustrates a cross-sectional diagram of a conventional light-emitting device 1. The light-emitting device 1 comprises a p-type semiconductor layer 10, an n-type semiconductor layer 14, and an active layer 12 formed between the p-type semiconductor layer 10 and the n-type semiconductor layer 14. The active layer 12 comprises a plurality of barrier layers 12b and a plurality of well layers 12a stacking alternately. A p-side electron blocking layer 11 is formed between the active layer 12 and the p-type semiconductor layer 10. The p-side electron blocking layer 11 acts as an energy barrier layer to prevent electron overflow. FIG. 1B illustrates an energy band diagram of the light-emitting device 1. The energy band of the p-side electron blocking layer 11 is higher than that of the barrier layer 12b.

FIG. 2A illustrates a hole concentration diagram of the light-emitting device 1. The hole concentration near the p-type semiconductor layer 10 is higher than the hole concentration near the n-type semiconductor layer 14. FIG. 2B illustrates an electron concentration diagram of the light-emitting device 1. Because electrons are relative light in weight compared with holes, the rate of the electron moving towards the p-type semiconductor layer 10 is more quickly than the rate of the hole moving towards the n-type semiconductor layer 14. The electron concentration near the p-type semiconductor layer 10 is higher than the electron concentration near the n-type semiconductor layer 14. FIG. 2C illustrates a radiative recombination rate diagram of the light-emitting device 1. Most of the electrons from the n-type semiconductor layer 14 recombine with the holes from the p-type semiconductor layer 10 at a position near the p-type semiconductor layer 10. Because the radiative recombination rate near the n-type semiconductor layer 14 is slow, the light generated by the electron-hole recombination in the active layer 12 of the light-emitting device 1 is reduced.

SUMMARY OF THE APPLICATION

A light-emitting device comprises a first semiconductor layer; a second semiconductor layer; an active layer formed between the first semiconductor layer and the second semiconductor layer; a first electron blocking layer formed between the first semiconductor layer and the active layer; and a second electron blocking layer formed between the second semiconductor layer and the active layer, wherein the thickness of the second electron blocking layer is not equal to that of the first electron blocking layer, and/or the band gap energy of the second electron blocking layer is not equal to that of the first electron blocking layer.

DETAILED DESCRIPTION OF PREFERRED EMBODIMENTS

Figure 1A:
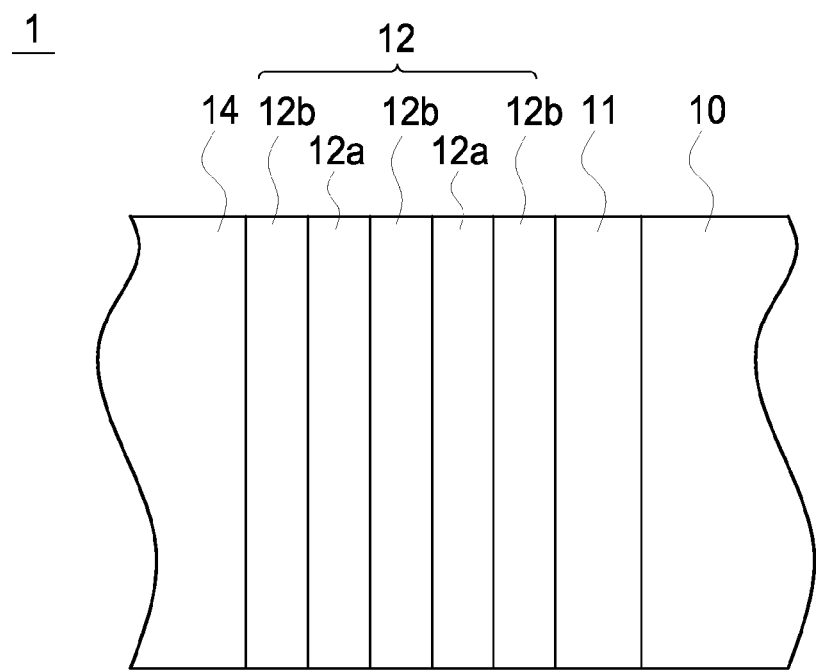
FIG. 1 illustrates a cross-sectional diagram of a conventional light-emitting device.
FIG. 1B illustrates an energy band diagram of a conventional light-emitting device.
Figure 1B:
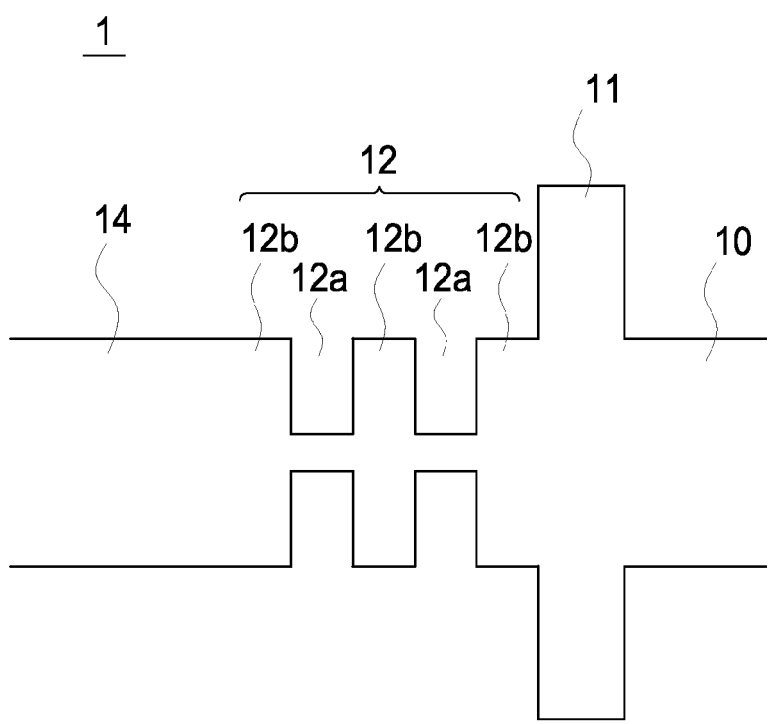

The embodiments of the application are illustrated in detail, and are plotted in the drawings. The same or the similar part is illustrated in the drawings and the specification with the same number.

Figure 3:
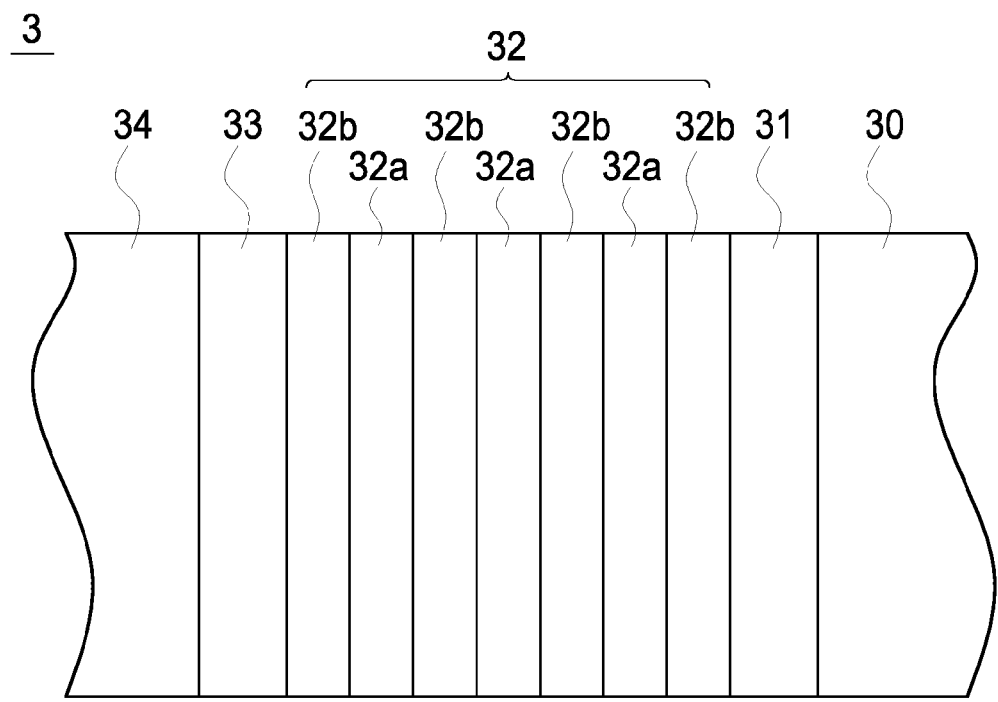
FIG. 3 illustrates a cross-sectional diagram of a light-emitting device in accordance with an embodiment of the present application.

FIG. 3 illustrates a cross-sectional diagram of a light-emitting device 3 in accordance with an embodiment of the present application. The light-emitting device 3 comprises a first semiconductor layer 30; a second semiconductor layer 34; an active layer 32 formed between the first semiconductor layer 30 and the second semiconductor layer 34; a first electron blocking layer 31 formed between the first semiconductor layer 30 and the active layer 32; and a second electron blocking layer 33 formed between the second semiconductor layer 34 and the active layer 32. The polarity of the first semiconductor layer 30 is different from the polarity of the second semiconductor layer 34. In the present embodiment, the first semiconductor layer 30 can be a p-type semiconductor layer and the second semiconductor layer 34 can be an n-type semiconductor layer. The active layer 32 comprises a multi-quantum well (MQW) structure, heterostructure, or double heterostructure (DH). Taking the active layer 32 having the multi-quantum well (MQW) structure as an example, the active layer 32 comprises a plurality of barrier layers 32b and a plurality of well layers 32a stacking alternately. The outermost side of the active layer 32 is the barrier layer 32b, and the well layer 32a is formed between each two barrier layers 32b. The band gap energy of the barrier layer 32b is larger than the band gap energy of the well layer 32a, and the band gap energies of the barrier layers 32b of the quantum well structure are substantially the same.

The material of the light-emitting device 3 is Ga-N based material capable of emitting UV light to blue light. In accordance with an embodiment of the present application, the material of the first semiconductor layer 30, the second semiconductor layer 34 and the active layer 32 comprise $Al_xGa_yIn_{1-x-y}N$, $0 \leq x \leq 1$, $0 \leq y \leq 1$. Besides a metal organic chemical vapor deposition method (MOCVD method), the first semiconductor layer 30, the second semiconductor layer 34 and the active layer 32 can be formed by a known method such as a molecular beam epitaxy method (MBE method), a hydride vapor phase epitaxy method (HVPE method), a sputtering method, an ion-plating method, or an electron showering method. If the Al composition of $Al_xGa_yIn_{1-x-y}N$ is increased, the band gap energy of the first semiconductor layer 30 and/or the second semiconductor layer 34 increases. If the In composition of $Al_xGa_yIn_{1-x-y}N$ is increased, the band gap energy of the first semiconductor layer 30 and/or the second semiconductor layer 34 decreases. In accordance with an embodiment of the present application, the band gap energy of the first semiconductor layer 30 and/or the second semiconductor layer 34 can be equal to the band gap energy of the barrier layer 32b by selecting appropriate material and its composition. In accordance with another embodiment of the present application, the band gap energy of the first semiconductor layer 30 and/or the second semiconductor later 34 can be smaller or higher than the band gap energy of the barrier layer 32b by selecting appropriate material and its composition.

Figure 4:
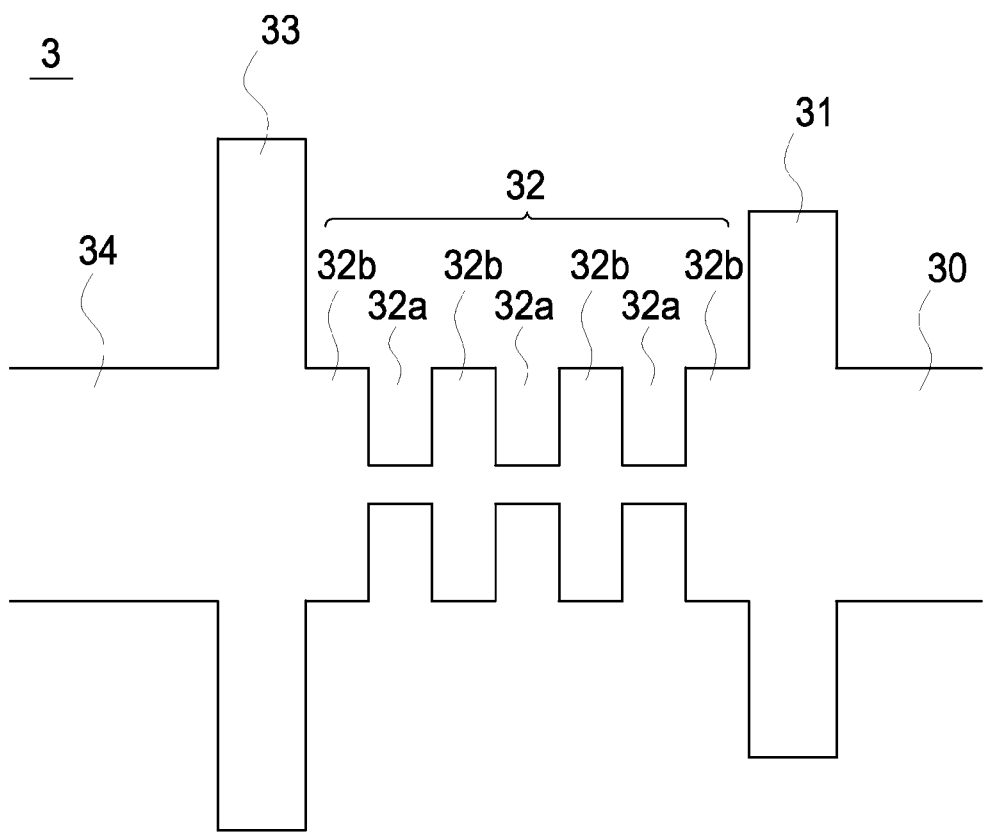
FIG. 4 illustrates a band gap energy diagram of a light-emitting device in accordance with an embodiment of the present application.

As illustrated in FIG. 3, both the first electron blocking layer 31 and the second electron blocking layer 33 act as energy barrier layers to prevent electron overflow. FIG. 4 illustrates a band gap energy diagram of the light-emitting device 3 in accordance with an embodiment of the present application. The band gap energy of the first electron blocking layer 31 is larger than the band gap energy of the first semiconductor layer 30, and/or the band gap energy of the second electron blocking layer 33 is larger than the band gap energy of the second semiconductor layer 34. The band gap energy of the first electron blocking layer 31 is larger than the band gap energy of the barrier layer 32b, and/or the band gap energy of the second electron blocking layer 33 is larger than the band gap energy of the barrier layer 32b. In the present embodiment, the band gap energy of the second electron blocking layer 33 is not equal to the band gap energy of the first electron blocking layer 31, wherein the band gap energy of the second electron blocking layer 33 is preferably larger than the band gap energy of the first electron blocking layer 31. In the present embodiment, the band gap energy of the first electron blocking layer 31 is between 3.4~6 eV, and/or the band gap energy of the second electron blocking layer 33 is between 3.4~6 eV.

Taking the first semiconductor layer 30 being a p-type semiconductor layer and the second semiconductor layer 34 being an n-type semiconductor layer as an example, the electrons from the second semiconductor layer 34 are confined by the second electron blocking layer 33 first. After the electrons flow into the active layer 32, the electrons are further confined in the active layer 32 by the first electron blocking layer 31 to participate in radiative recombination with the holes from the first semiconductor layer 30.

In the present embodiment, the thickness of the second electron blocking layer 33 is not equal to the thickness of the first electron blocking layer 31. The thickness of the second electron blocking layer 33 is preferably larger than the thickness of the first electron blocking layer, wherein the thickness of the second electron blocking layer 33 is between 20 nm and 100 nm and the thickness of the first electron blocking layer 31 is smaller than 30 nm.

In the present embodiment, the material of the first electron blocking layer 31 and/or the second electron blocking layer 33 comprises $Al_xGa_yIn_{1-x-y}N$, $0 \leq x \leq 1$, $0 \leq y \leq 1$. The first electron blocking layer 31 and/or the second electron blocking layer 33 can be doped or undoped. The Al composition of the first electron blocking layer 31 and the second electron blocking layer 33 can be adjusted. To be more specific, the Al composition of the first electron blocking layer 31 is lower than 25%, and/or the Al composition of the second electron blocking layer 33 is lower than 25%. The band gap energy of the first electron blocking layer 31 or the band gap energy of the second electron blocking layer 33 increases accompanied with the increase of the Al composition, wherein the band gap energy of the second electron blocking layer 33 is preferably larger than the band gap energy of the first electron blocking layer 31. Besides a metal organic chemical vapor deposition method (MOCVD method), the first electron blocking layer 31 and the second electron blocking layer 33 can be formed by a known method such as a molecular beam epitaxy method (MBE method), a hydride vapor phase epitaxy method (HVPE method), a sputtering method, an ion-plating method, or an electron showering method.

In another embodiment of the present application, the material of the first electron blocking layer 31 and/or the second electron blocking layer 33 comprises $AlP_xN_{1-x}$, wherein $x \geq 0$. The P composition of the first electron blocking layer 31 and the second electron blocking layer 33 can be adjusted. The P composition of the first electron blocking layer 31 is lower than 30%, and/or the P composition of the second electron blocking layer 33 is lower than 30%. In accordance with an embodiment of the present application, the P composition of the first electron blocking layer 31 is higher than the P composition of the second electron blocking layer 33. The band gap energy of the first electron blocking layer 31 or the band gap energy of the second electron blocking layer 33 decreases accompanied with the increase of the P composition, wherein the band gap energy of the second electron blocking layer 33 is preferably larger than the band gap energy of the first electron blocking layer 31. The P composition of the first electron blocking layer 31 is higher than that of the second electron blocking layer 33. Besides a metal organic chemical vapor deposition method (MOCVD method), the first electron blocking layer 31 and the second electron blocking layer 33 can be formed by a known method such as a molecular beam epitaxy method (MBE method), a hydride vapor phase epitaxy method (HVPE method), a sputtering method, an ion-plating method, or an electron showering method.

In accordance with an embodiment of the present application, the light-emitting device 3 is capable of emitting an incoherent light.

Figure 2A:
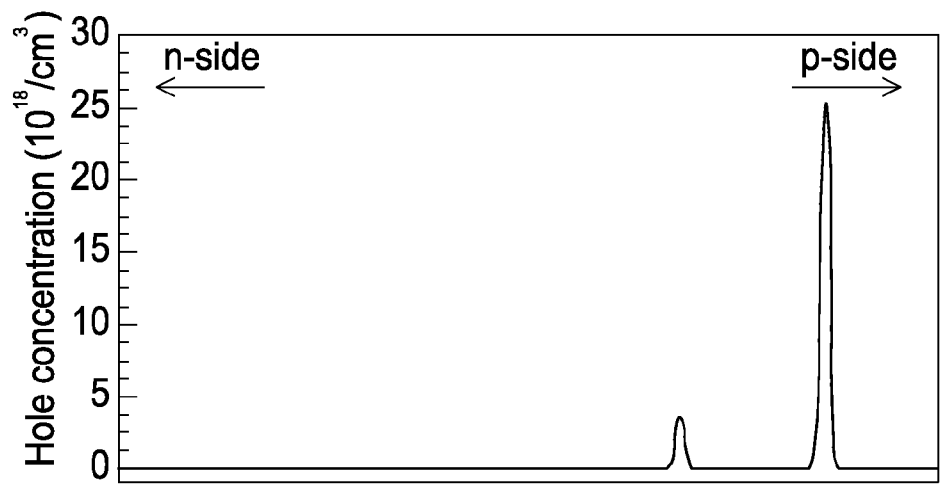
FIG. 2A illustrates a hole concentration diagram of a conventional light-emitting device.
Figure 2B:
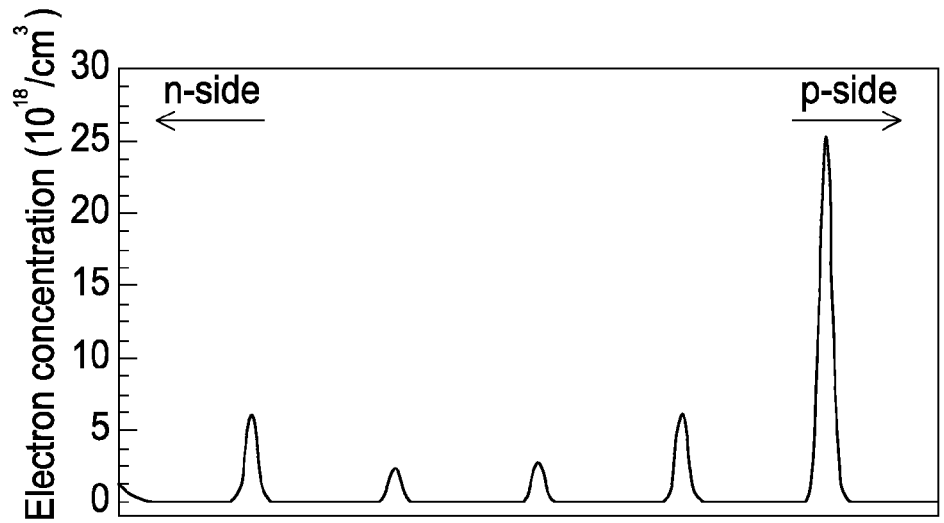
FIG. 2B illustrates an electron concentration diagram of a conventional light-emitting device.
Figure 2C:
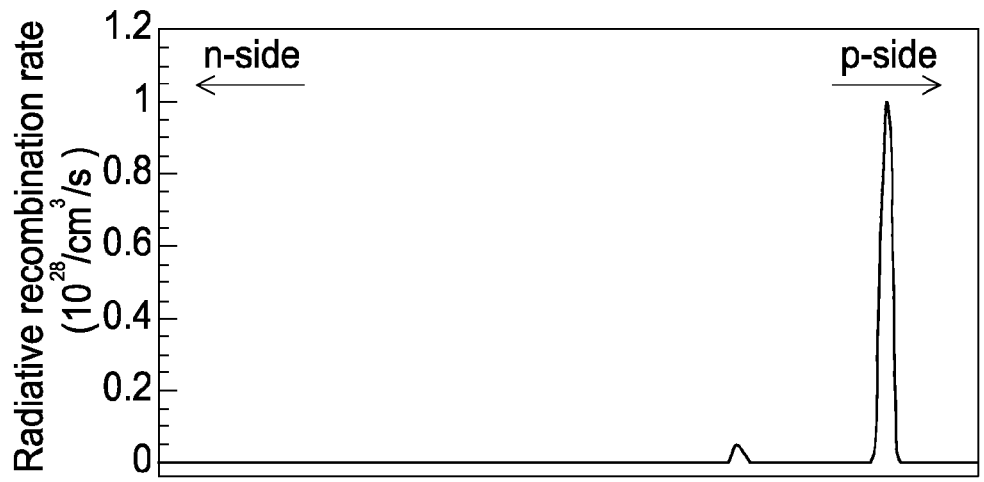
FIG. 2C illustrates a radiative recombination rate diagram of a conventional light-emitting device.
Figure 5:
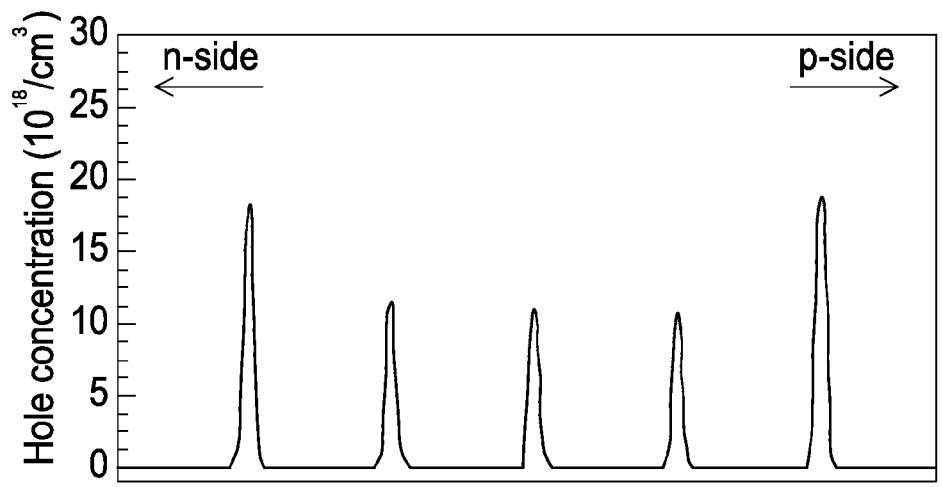
FIG. 5 illustrates a hole concentration diagram of a light-emitting device in accordance with an embodiment of the present application.
Figure 6:
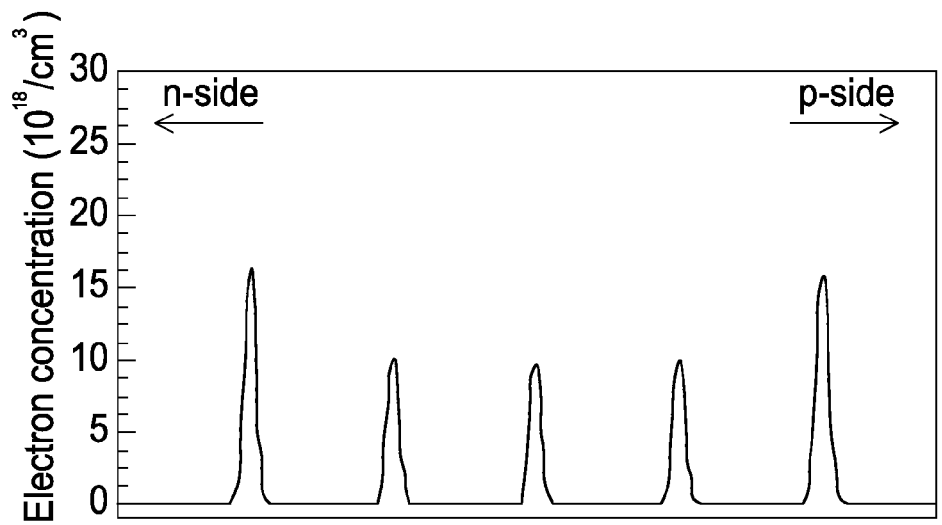
FIG. 6 illustrates an electron concentration diagram of a light-emitting device in accordance with an embodiment of the present application.
Figure 7:
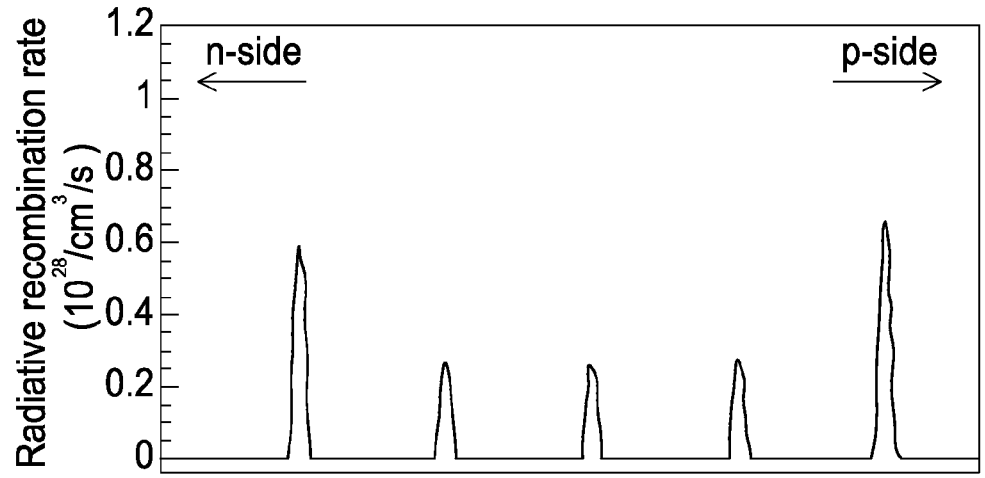
FIG. 7 illustrates a radiative recombination rate diagram of a light-emitting device in accordance with an embodiment of the present application.

FIG. 5 illustrates a hole concentration diagram of the light-emitting device 3 in accordance with an embodiment of the present application. The hole concentration of the active layer 32 is higher and more uniform than the hole concentration of the active layer 12 illustrated in FIG. 2A. FIG. 6 illustrates an electron concentration diagram of the light-emitting device 3 in accordance with an embodiment of the present application. The electron concentration in the active layer 32 is higher and more uniform than the electron concentration of the active layer 12 illustrated in FIG. 2B. FIG. 7 illustrates a radiative recombination rate diagram of the light-emitting device 3 in accordance with an embodiment of the present application. The radiative recombination rate of the electrons and the holes in the active layer 32 is higher than the radiative recombination rate of the electrons and the holes in the active layer 12 illustrated in FIG. 2C.

Figure 8:
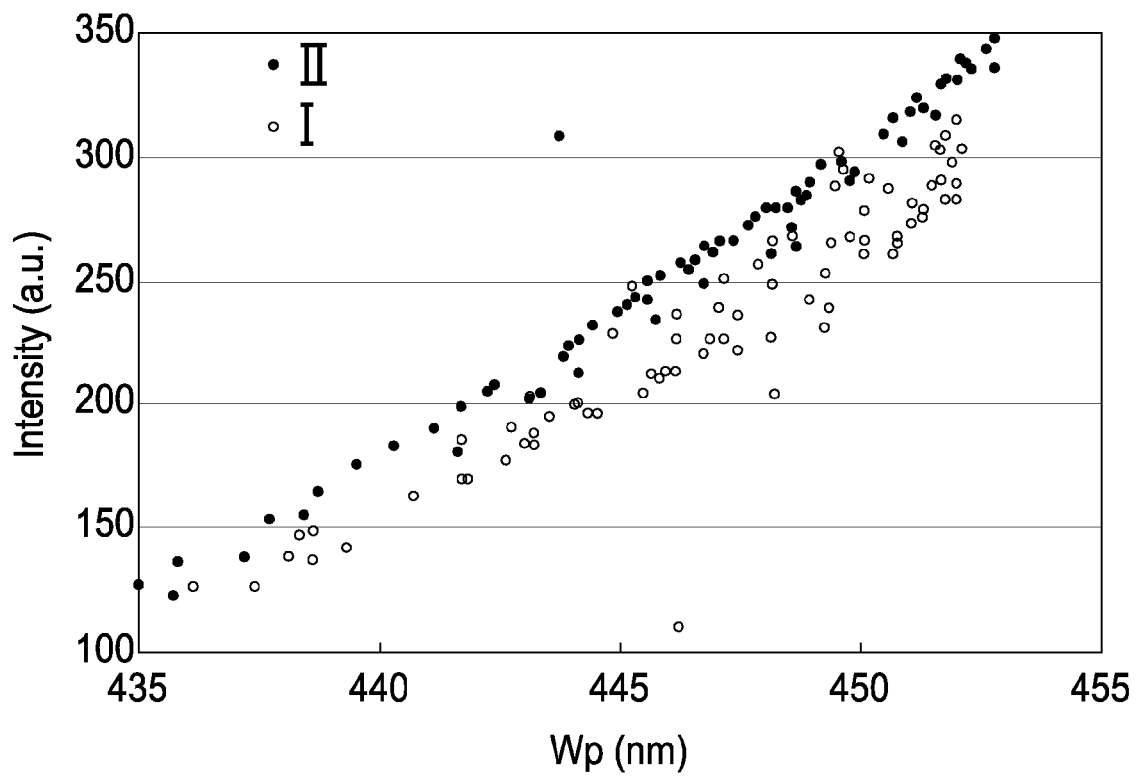
FIG. 8 illustrates a light intensity diagram of a light-emitting device in accordance with an embodiment of the present application and a light intensity diagram of a conventional light-emitting device.

FIG. 8 illustrates a light intensity diagram of a light-emitting device 3 in accordance with an embodiment of the present application and a light intensity diagram of a conventional light-emitting device 1. The line I illustrates the light intensity diagram of the conventional light-emitting device 1, and the line II illustrates the light intensity diagram of the light-emitting device 3 in accordance with an embodiment of the present application. Taking the light intensity of the wavelength between 435 nm and 455 nm as an example, the light intensity of the light-emitting device 3 with both the first electron blocking layer 31 and the second electron blocking layer 33 is larger than the light intensity of the conventional light-emitting device 1 with only the p-side electron blocking layer 11.

Figure 9:
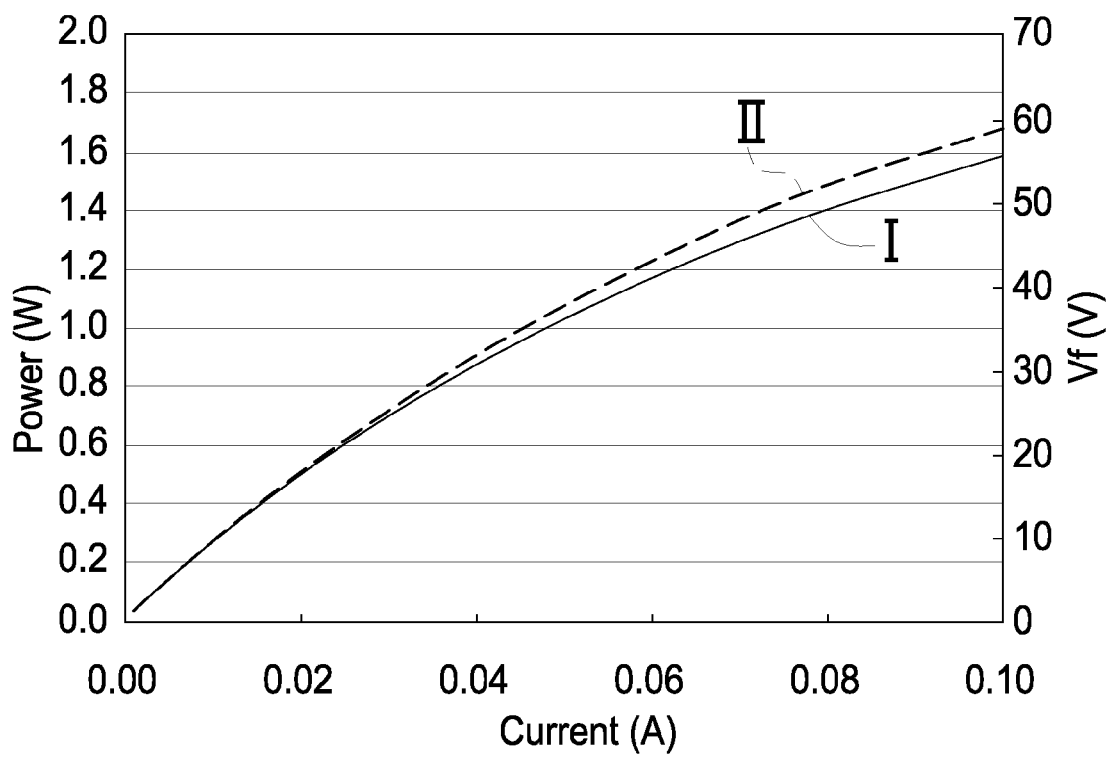
FIG. 9 illustrates a power diagram of a light-emitting device in accordance with an embodiment of the present application and a power diagram of a conventional light-emitting device.

FIG. 9 illustrates a power diagram of a light-emitting device 3 in accordance with an embodiment of the present application and a power diagram of a conventional light-emitting device 1. The line I illustrates the power diagram of the conventional light-emitting device 1, and the line II illustrates the power diagram of the light-emitting device 3 in accordance with an embodiment of the present application. The power of the light-emitting device 3 with both the first electron blocking layer 31 and the second electron blocking layer 33 is higher than the conventional light-emitting device 1 with only the p-side electron blocking layer 11.

Figure 10:
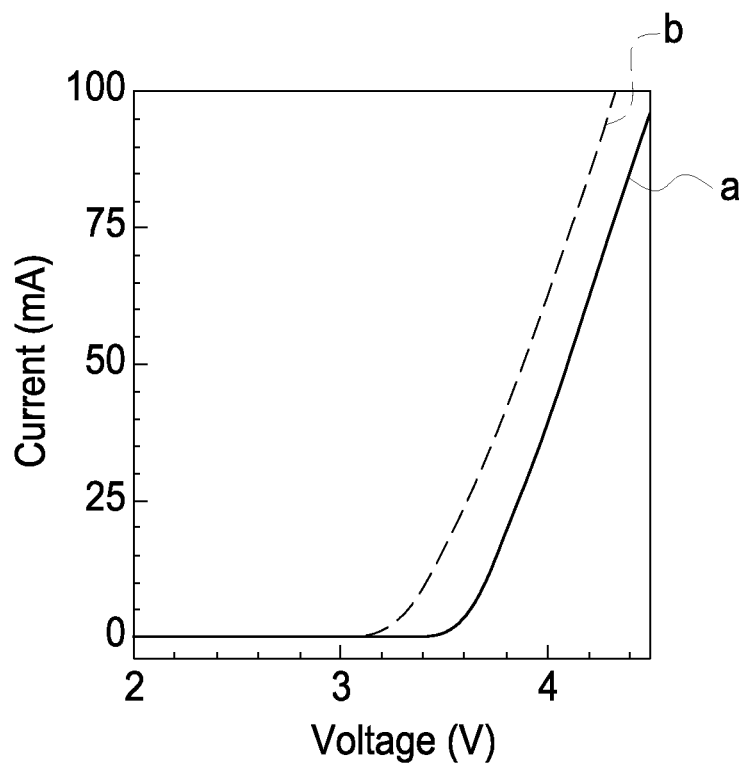
FIG. 10 illustrates an current-voltage diagram of a light-emitting device.
Figure 11:
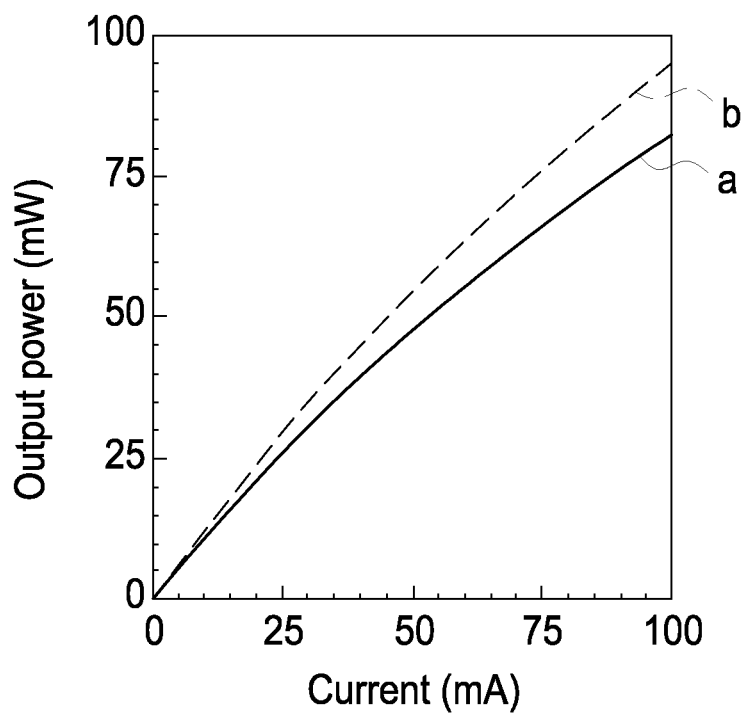
FIG. 11 illustrates an output power diagram of a light-emitting device.

FIG. 10 illustrates a current-voltage diagram of a light-emitting device in accordance with an embodiment of the present application. FIG. 11 illustrates an output power diagram of a light-emitting device in accordance with an embodiment of the present application. Line "a" illustrates a current-voltage diagram of a light-emitting device having a first electron blocking layer 31 of 20 nm thickness, 15% Al composition, formed near the p-type semiconductor layer, and a second electron blocking layer 33 of 20 nm thickness, 15% Al composition, formed near the n-type semiconductor layer. Line "b" illustrates a current-voltage diagram of a light-emitting device having a first electron blocking layer 31 of 10 nm thickness, 7% Al composition, formed near the p-type semiconductor layer, and a second electron blocking layer 33 of 20 nm thickness, 15% Al composition, formed near the n-type semiconductor layer.

As illustrated in FIG. 10, the forward voltage of the light-emitting device shown in line "b" is lower than the forward voltage of the light-emitting device shown in line "a". The forward voltage of the light-emitting device can be reduced by adjusting the thickness of the first electron blocking layer 31 near the p-type semiconductor layer or the thickness of the second electron blocking layer 33 near the n-type semiconductor layer. The thinner the first electron blocking layer 31 formed near the p-type semiconductor layer is, the lower of the forward voltage is. The lesser of the Al composition of the first electron blocking layer 31 formed near the p-type semiconductor layer is, the lower of the forward voltage is.

As illustrated in FIG. 11, the output power of the light-emitting device shown in line "b" is higher than the output power of the light-emitting device shown in line "a". The light-emitting device shown in line "b" comprise the first electron blocking layer 31 of less Al composition and thinner thickness, wherein less Al composition reduces the band gap energy, and thinner thickness helps the hole injection. Because more holes are injected into the active layer 32, the output power of the light-emitting device shown in line "b" is higher than the output power of the light-emitting device shown in line "a".

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a first semiconductor layer;
a second semiconductor layer;
an active layer formed between the first semiconductor layer and the second semiconductor layer;
a first electron blocking layer for reducing electron overflow from the active layer to the first semiconductor layer, interposed between the first semiconductor layer and the active layer; and
a second electron blocking layer for reducing electron overflow from the active layer to the second semiconductor layer, interposed between the second semiconductor layer and the active layer, wherein the thickness of the second electron blocking layer is not equal to that of the first electron blocking layer, and/or the band gap energy of the second electron blocking layer is not equal to that of the first electron blocking layer,
wherein the material of the first electron blocking layer and/or the second electron blocking layer comprises $Al_xGa_yIn_{1-x-y}N$, $0 \leq x \leq 1$, $0 \leq y \leq 1$, and the Al composition of the first electron blocking layer is lower than 25%, and/or the Al composition of the second electron blocking layer is lower than 25%.

2. The light-emitting device according to claim 1, wherein the polarity of the first semiconductor layer is p type and the polarity of the second semiconductor layer is n type, and the thickness of the second electron blocking layer is larger than that of the first electron blocking layer.

3. The light-emitting device according to claim 1, wherein the polarity of the first semiconductor layer is p type and the polarity of the second semiconductor layer is n type, and the band gap energy of the second electron blocking layer is larger than that of the first electron blocking layer.

4. The light-emitting device according to claim 1, wherein the band gap energy of the first electron blocking layer is larger than that of the first semiconductor layer, and/or the band gap energy of the second electron blocking layer is larger than that of the second semiconductor layer.

5. The light-emitting device according to claim 4, wherein the first electron blocking layer is a single layer and the second electron blocking layer is a single layer, and wherein the band gap energy of the first electron blocking layer is between 3.4~6 eV, and/or the band gap energy of the second electron blocking layer is between 3.4~6 eV.

6. The light-emitting device according to claim 1, wherein the thickness of the second electron blocking layer is between 20 nm and 100 nm.

7. The light-emitting device according to claim 1, wherein the thickness of the first electron blocking layer is smaller than 30 nm.

8. The light-emitting device according to claim 1, wherein the active layer comprising a quantum well structure comprises a well layer and at least two barrier layers, wherein the well layer is formed between the two barrier layers.

9. The light-emitting device according to claim 8, wherein the band gap energy of the barrier layer is larger than that of the well layer.

10. The light-emitting device according to claim 8, wherein the band gap energy of the barrier layers of the quantum well structure is substantially the same.

11. The light-emitting device according to claim 8, wherein the band gap energy of the first electron blocking layer is larger than that of the barrier layer, and/or the band gap energy of the second electron blocking layer is larger than that of the barrier layer.

12. The light-emitting device according to claim 8, wherein the first electron blocking layer is formed between the barrier layer and the first semiconductor layer, and/or the second electron blocking layer is formed between the barrier layer and the second semiconductor layer.

13. The light-emitting device according to claim 1, wherein the material of the active layer comprises $Al_xGa_yN_{1-x-y}N$, $0 \leq x \leq 1$, $0 \leq y \leq 1$.

14. The light-emitting device according to claim 1, wherein the material of the first semiconductor layer comprises $Al_xGa_yN_{1-x-y}N$, $0 \leq x \leq 1$, $0 \leq y \leq 1$.

15. The light-emitting device according to claim 1, wherein the material of the second semiconductor layer comprises $Al_xGa_yN_{1-x-y}N$, $0 \leq x \leq 1$, $0 \leq y \leq 1$.

16. The light-emitting device according to claim 1, wherein the polarity of the first semiconductor layer is different from the polarity of the second semiconductor layer.

17. The light-emitting device according to claim 1, wherein the first electron blocking layer or the second electron blocking layer is doped.

* * * * *